(12) United States Patent
Boerner

(10) Patent No.: US 7,807,276 B2
(45) Date of Patent: Oct. 5, 2010

(54) ELECTROLUMINESCENT COMPOUNDS CONTAINING EXCITON CONDUCTING COMPOUND

(75) Inventor: Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 949 days.

(21) Appl. No.: 11/568,624

(22) Filed: Nov. 3, 2006

(65) Prior Publication Data

US 2007/0166568 A1　　Jul. 19, 2007

(30) Foreign Application Priority Data

May 4, 2004　　(EP)　　................................. 04101900

(51) Int. Cl.
*B32B 19/00*　　(2006.01)
*B32B 9/00*　　(2006.01)
*H01L 51/00*　　(2006.01)
*H01L 51/05*　　(2006.01)
*H01L 51/30*　　(2006.01)
*H01L 51/50*　　(2006.01)
*H05B 33/14*　　(2006.01)

(52) U.S. Cl. ........................ 428/690; 428/917; 528/422; 313/503; 313/504; 313/506

(58) Field of Classification Search ................. 428/690, 428/917; 528/422; 313/503, 504, 506
See application file for complete search history.

(56) References Cited

U.S. PATENT DOCUMENTS

| 5,955,836 | A | * | 9/1999 | Boerner et al. ............... 313/506 |
| 6,097,147 | A | | 8/2000 | Baldo et al. |
| 6,635,364 | B1 | | 10/2003 | Igarashi |
| 2002/0055015 | A1 | | 5/2002 | Sato et al. |
| 2002/0146589 | A1 | | 10/2002 | Akiyama et al. |
| 2003/0148142 | A1 | | 8/2003 | Fryd et al. |

FOREIGN PATENT DOCUMENTS

| DE | 19726472 A1 | 12/1998 |
| EP | 0936844 A2 | 8/1999 |
| JP | 01256584 A | 10/1989 |
| JP | 11256148 A1 | 9/1999 |
| WO | 9858037 A1 | 12/1998 |

* cited by examiner

*Primary Examiner*—Duc Truong

(57) ABSTRACT

A light emitting layer for an organic LED, comprising at least one electron transporting compound, at least one hole transporting compound and a rare earth metal ion compound, whereby the light emitting layer furthermore comprises at least one exciton conducting compound.

14 Claims, 1 Drawing Sheet

I (A)

ELECTROLUMINESCENT COMPOUNDS CONTAINING EXCITON CONDUCTING COMPOUND

Figure 1:
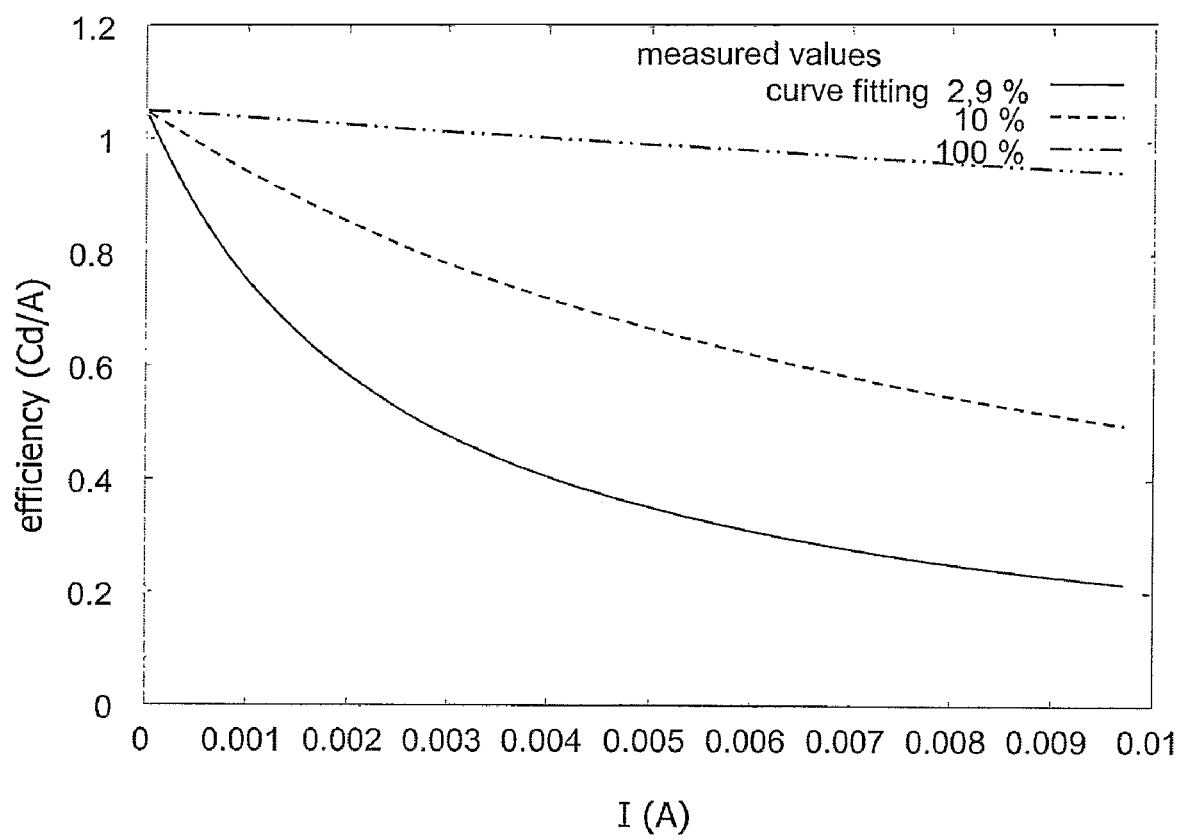

This invention relates to electroluminescent compounds and in particular to electroluminescent compounds used in organic LED's (OLEDs).

OLEDs usually comprise metal complexes, in which a central metal ion atom is coordinated by one or more suitable ligands. The luminescence in OLEDs is usually accomplished in that there are certain molecules present, which have hole transporting properties, and other molecules, which have electron transporting properties. These molecules are usually organic molecules. By recombination of a hole and an electron, suitable molecules are excited to a higher state. The excitation energy is then transferred to the metal ions bound in the metal complexes. These metal ions then undergo radiative de-excitation and emit light.

In suitable complexes, which contain e.g. Europium (III) and Terbium (III) as central metal ions, photoluminescence yields as much as 75% have be found. However, when these complexes were used in OLEDs, the luminescence yield dropped dramatically.

The inventors have studied these phenomena carefully and have come to the conclusion that in OLEDs not all available complex molecules are excited. Furthermore, the possibility that a ligand of a complex in which the metal ion is already in an excited state, is excited once more, is rather high. Usually, the central metal ion atom in this complex cannot accept the additional energy, which is then wasted in radiationless transitions to the ground state of the ligand. Due to this saturation effect, the wanted fluorescence or luminescence cannot take place.

It is therefore an objective of the present invention to provide an electroluminescent compound, which is suitable of having a higher photoluminescence, and an electroluminescent device having such an electroluminescent compound and a lighting unit having such an electroluminescent device.

This objective is achieved by a lighting unit with a light emitting layer comprising at least one electron transporting compound, at least one hole transporting compound and at least one rare earth metal ion compound, whereby the light emitting layer furthermore comprises at least one exciton conducting compound. These compounds can either be different molecular species, or they can be different ligands of the metal complex.

"Rare earth metal ion compound" in the sense of the present invention means in particular that the rare earth metal ion is selected from a group comprising La, Ce, Pr, Nd, Pm, Sm, Eu, Gd, Tb, Dy, Ho, Er, Tm, Yb, Lu ions or mixtures thereof.

By using at least one exciton conducting compound, the excitation energy can be transferred to this exciton conducting compound in case the metal ion is already in the excited state, thereby preventing a double or multiple excitation of the metal ion and the saturation effects. An exciton conducting compound in the sense of the invention is in particular a compound to which an excitation e.g. due to recombination of holes and electrodes in the light-emitting layer can be transferred.

The finctional principle of the inventive exciton conducting compound will now be described in greater detail:

The present invention is applicable for lighting unit with light-emitting layers, which comprise rare earth metal ion compounds. These rare earth metal ions are usually bound to ligands; however, the bonds between the rare earth metal ions and the ligands are so weak that in first order approximation excitations can be considered to be localized either on the metal ion or on one of the ligands. This stands in contrast to complexes e.g. using Iridium ions, where more or less covalent bonds are present and excitations are therefore distributed over the complex as a whole.

In case of a recombination between a hole and an electron, excitation of one of the ligands takes place. It has been shown that in nearly 100% of the cases due to the heavy-ion effect an intersystem crossing occurs, thus the energy reaches the lowest triplet state. This triplet state then transfers the energy to the rare earth metal ions; finally, these metal ions emit the light. Since the radiative lifetime of the excited ion levels of Eu(III) and Tb(III) is on of the order of hundreds of microseconds, there is the strong possibility that double- or even multiple excitation may take place, as described above.

This saturation problem leads to a dramatic drop in the luminescence yield. This can best be seen in the accompanying FIG. 1 which shows a saturation curve for an OLED with the complex Eu(III)(thd)$_3$phen as the emitter and three theoretical curves for 2.9%, 10% and 100% excitation efficiency of the metal ions present in the OLED.

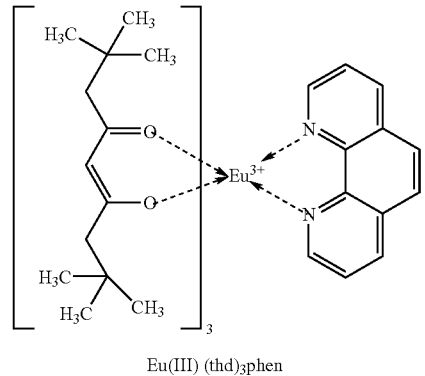

Eu(III) (thd)$_3$phen

As can be seen from FIG. 1, the luminescence efficiency drops dramatically with increasing current after reaching a maximum at approx. 0.00025 A. By curve fitting the percentage of excited metal ions was calculated. As can be seen in FIG. 1, the measured values fit accurately to a theoretical curve assuming an excitation rate of only 2.9%. For comparison, the theoretical curves for 10% and 100% were also included in FIG. 1.

According to the present invention, the problem of double- or multiple excitation is overcome by adding an exciton conducting compound, to which the excitation can be transferred to in case the rare earth metal ion compound is already excited. Since in light-emitting systems as used within the present invention the excitation is localized on the molecules and ligands, the excitation is effectively removed from the rare earth metal ion compound, which then is not double-excited. Since triplet excitons are comparatively long-lived, they can be transferred over long distances. They have therefore a high chance of finding other complex molecules, where the central ion is not yet excited. In this way, the excitation energy is transported from the volume in the OLED where the excitation density is highest to other parts, where the excitation density is not so high.

According to a preferred embodiment, the exciton conducting compound has a triplet level lower in energy than either the electron transporting compounds, the hole transporting compounds or both. Thus, a good transfer of excitation to the exciton conducting compound can be achieved.

Preferably the difference between the triplet niveaus of the exciton conducting compound and the electron transporting compounds and/or the hole transporting compounds is $\geq 0$ cm$^{-1}$ and $\leq 4000$ cm$^{-1}$, preferably $\geq 500$ cm$^1$ and $\leq 3000$ cm$^{-1}$ and most preferred $\geq 1000$ cm$^{-1}$ and $\leq 2000$ cm$^{-1}$.

According to a preferred embodiment the exciton conducting compound has a energetically higher triplet energy than the rare earth metal ion compound resonance level. By doing so it is guaranteed that the rare earth metal ion compound is properly excited; furthermore, a transfer of excitation from the exciton conducting compound to the rare earth metal ion compound is possible, thus even more improving the luminescence yield. Preferably the difference between the triplet niveaus of the exciton conducting compound and the rare earth metal ion compound is $\geq 0$ cm$^{-1}$ and $\leq 4000$ cm$^{-1}$, preferably $\geq 500$ cm$^{-1}$ and $\leq 3000$ cm$^{-1}$ and most preferred $\leq 500$ cm$^{-1}$ and $\leq 1000$ cm$^{-1}$.

According to a preferred embodiment of the present invention, the oxidation potential (in V, measured against the vacuum level at zero Volts, thus using negative values) of the exciton conducting compound is lower than the oxidation potential of the hole transporting compounds. Thus, the exciton conducting compound is more difficult to oxidize than the hole transporting compound. By this, destruction of the excitons is prevented and a high efficacy of the light emitting layer is maintained. Preferably the difference in oxidation potential of the exciton conducting compound and the oxidation potential of the hole transporting compounds is $\geq 0$ V and $\leq 0.5$ V, preferably $\geq 0.05$ V and $\leq 0.3$ V and most preferred $\geq 0.1$ V and $\leq 0.2$ V. Furthermore, the preferred oxidation potential of the exciton conducting compound is $<-4.5$ V and $>-6.3$ V, preferably $<-4.8$ V and $>-6$ V and most preferred $<-5$ V and $>-5.7$ V.

According to a preferred embodiment of the present invention, the oxidation potential (in V against vacuum level, therefore in negative values) of the hole transporting compound is higher than both the oxidation potential of the electron transporting compound and the exciton conducting compound. By doing so, it is guaranteed that the hole transport in the light-emitting layer occurs essentially via the hole-transporting compound and not via the exciton conducting compound or the electron transporting compound.

According to a preferred embodiment of the present invention, the reduction potential (in V against vacuum level, therefore in negative values) of the exciton conducting compound is higher than the reduction potential of the electron transporting compounds. Thus, the exciton conducting compound is more difficult to reduce than the electron transporting compound. By this, destruction of the excitons is prevented and a high efficacy of the light emitting layer is maintained. Preferably the difference in reduction potential of the exciton conducting compound and the reduction potential of the electron transporting compounds is $\geq 0$ V and $\leq 0.5$ V, preferably $\geq 0.05$ V and $\leq 0.3$ V and most preferred $\geq 0.1$ V and $\leq 0.2$ V. Furthermore, the preferred reduction potential of the exciton conducting compound is $\leq -1.5$ V and $\geq -4$ V, preferably $\leq -2$ V and $\geq -3.5$ V and most preferred $\leq -2$ V and $\geq -3$ V.

According to a preferred embodiment of the present invention, the reduction potential (in V against vacuum level, therefore in negative numbers) of the electron transporting compound is lower than both the reduction potential of the hole transporting compounds and the exciton conducting compounds. By doing so, it is guaranteed that the electron transport in the light-emitting layer occurs essentially via the electron transporting compound and not via the exciton conducting compound or the hole transporting compound.

The exciton conducting compound may be bound to the metal ion and serve as a ligand; on the other hand it is also possible to use exciton conducting compounds who are not bound to the metal ion.

According to a preferred embodiment of the present invention, the thickness of the light emitting layer is $\geq 0$ nm and $\leq 60$ preferably $\geq 5$ nm and $\leq 40$ and most preferred $\geq 10$ nm and $\leq 30$ nm. By doing so, an optimum in light emitting efficacy can be reached and maintained.

According to a preferred embodiment of the present invention, the concentration of exiton conducting compounds in the light emitting layer is higher than the concentration of either the electron transporting compounds, the hole transporting compounds or higher than both concentrations. By doing so, an efficient transfer of excitation to the exiton conducting compounds can be achieved.

The concentration of rare earth metal ion atoms present in the light emitting layer is in wt % of the total weight of the layer preferably between $\geq 5$ and $\leq 50\%$ (wt %), more preferably between $\geq 10$ and $\leq 45\%$ (wt %), more preferably between $\geq 15$ and $\leq 40\%$ (wt %), and most preferably between $\geq 20$ and $\leq 30\%$ (wt %).

Generic group definition: Throughout the description and claims generic groups have been used, for example alkyl, alkoxy, aryl. Unless otherwise specified the following are preferred groups that may be applied to generic groups found within compounds disclosed herein:

alkyl: linear and branched C1-C8-alkyl,
alkenyl: C2-C6-alkenyl,
cycloalkyl: C3-C8-cycloalkyl,
alkoxy: C1-C6-alkoxy,
alkylene: selected from the group consisting of:
methylene; 1,1-ethylene; 1,2-ethylene; 1,1-propylidene; 1,2-propylene; 1,3-propylene; 2,2-propylidene; butan-2-ol-1,4-diyl; propan-2-ol-1,3-diyl; 1,4-butylene; cyclohexane-1,1-diyl; cyclohexan-1,2-diyl; cyclohexan-1,3-diyl; cyclohexan-1,4-diyl; cyclopentane-1,1-diyl; cyclopentan-1,2-diyl; and cyclopentan-1,3-diyl,
aryl: selected from homoaromatic compounds having a molecular weight under 300,
arylene: selected from the group consisting of: 1,2-phenylene; 1,3-phenylene; 1,4-phenylene; 1,2-naphtalenylene; 1,3-naphtalenylene; 1,4-naphtalenylene; 2,3-naphtalenylene; 1-hydroxy-2,3-phenylene; 1-hydroxy-2,4-phenylene; 1-hydroxy-2,5-phenylene; and 1-hydroxy-2,6-phenylene,
heteroaryl: selected from the group consisting of: pyridinyl; pyrimidinyl; pyrazinyl; triazolyl; pyridazinyl; 1,3,5-triazinyl; quinolinyl; isoquinolinyl; quinoxalinyl; imidazolyl; pyrazolyl; benzimidazolyl; thiazolyl; oxazolidinyl; pyrrolyl; carbazolyl; indolyl; and isoindolyl, wherein the heteroaryl may be connected to the compound via any atom in the ring of the selected heteroaryl,
heteroarylene: selected from the group consisting of: pyridindiyl; quinolindiyl; pyrazodiyl; pyrazoldiyl; triazolediyl; pyrazindiyl; and imidazolediyl, wherein the heteroarylene acts as a bridge in the compound via any atom in the ring of the selected heteroarylene, more specifically preferred are: pyridin-2,3-diyl; pyridin-2,4-diyl; pyridin-2,5-diyl; pyridin-2,6-diyl; pyridin-3,4-diyl; pyridin-3,5-diyl; quinolin-2,3-diyl; quinolin-2,4-diyl; quinolin-2,8-diyl; isoquinolin-1,3-diyl; isoquinolin-1,4-diyl; pyrazol-1,3-diyl; pyrazol-3,5-diyl; triazole-3,5-diyl; triazole-1,3-diyl; pyrazin-2,5-diyl; and imidazole-2,4-diyl, a —C1-C6-heterocycloalkyl, wherein the heterocycloalkyl of the —C1-C6-heterocycloalkyl is, selected from the group consisting of: piperidinyl; piperidine; 1,4-piperazine, tetrahydrothiophene; tetrahydrofuran; 1,4,7-triazacyclononane; 1,4,8,11-tetraazacyclotetradecane; 1,4,7,10,13-pentaazacyclopentadecane; 1,4-diaza-7-thia-cyclononane; 1,4-diaza-7-oxa-cyclononane; 1,4,7,10-tetraazacyclododecane; 1,4-dioxane; 1,4,7-trithia-cyclononane; pyrrolidine; and tetrahydropyran, wherein the heterocycloalkyl may be connected to the —C1-C6-alkyl via any atom in the ring of the selected heterocycloalkyl, heterocycloalkylene: selected from the group consisting of: piperidin-1,2-ylene; piperidin-2,6-ylene; piperidin-4,4-ylidene; 1,4-piperazin-1,4-ylene; 1,4-piperazin-2,3-ylene; 1,4-piperazin-2,5-ylene; 1,4-piperazin-2,6-ylene; 1,4-piperazin-1,2-ylene; 1,4-piperazin-1,3-ylene; 1,4-piperazin-1,4-ylene; tetrahydrothiophen-2,5-ylene; tetrahydrothiophen-3,4-ylene; tetrahydrothiophen-2,3-ylene; tetrahydrofuran-2,5-ylene; tetrahydrofuran-3,4-ylene; tetrahydrofuran-2,3-ylene; pyrrolidin-2,5-ylene; pyrrolidin-3,4-ylene; pyrrolidin-2,3-ylene; pyrrolidin-1,2-ylene; pyrrolidin-1,3-ylene; pyrrolidin-2,2-ylidene; 1,4,7-triazacyclonon-1,4-ylene; 1,4,7-triazacyclonon-2,3-ylene; 1,4,7-triazacyclonon-2,9-ylene; 1,4,7-triazacyclonon-3,8-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetradec-2,5-ylene; 1,4,8,11-tetraazacyclotetradec-1,2-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-1,2-ylene; 1,4,7,10-tetraazacyclododec-2,3-ylene; 1,4,7,10-tetraazacyclododec-2,2-ylidene; 1,4,7,10,13 pentaazacyclopentadec-1,4-ylene; 1,4,7,10,13-pentaazacyclopentadec-1,7-ylene; 1,4,7,10,13-pentaazacyclopentadec-2,3-ylene; 1,4,7,10,13-pentaazacyclopentadec-1,2-ylene; 1,4,7,10,13-pentaazacyclopentadec-2,2-ylidene; 1,4-diaza-7-thia-cyclonon-1,4-ylene; 1,4-diaza-7-thia-cyclonon-1,2-ylene; 1,4-diaza-7-thia-cyclonon-2,3-ylene; 1,4-diaza-7-thia-cyclonon-6,8-ylene; 1,4-diaza-7-thia-cyclonon-2,2-ylidene; 1,4-diaza-7-oxacyclonon-1,4-ylene; 1,4-diaza-7-oxa-cyclonon-1,2-ylene; 1,4diaza-7-oxa-cyclonon-2,3-ylene; 1,4-diaza-7-oxa-cyclonon-6,8-ylene; 1,4-diaza-7-oxa-cyclonon-2,2-ylidene; 1,4-dioxan-2,3-ylene; 1,4-dioxan-2,6-ylene; 1,4-dioxan-2,2-ylidene; tetrahydropyran-2,3-ylene; tetrahydropyran-2,6-ylene; tetrahydropyran-2,5-ylene; tetrahydropyran-2,2-ylidene; 1,4,7-trithia-cyclonon-2,3-ylene; 1,4,7-trithia-cyclonon-2,9-ylene; and 1,4,7-trithia-cyclonon-2,2-ylidene, heterocycloalkyl: selected from the group consisting of: pyrrolinyl; pyrrolidinyl; morpholinyl; piperidinyl; piperazinyl; hexamethylene imine; 1,4-piperazinyl; tetrahydrothiophenyl; tetrahydrofuranyl; 1,4,7-triazacyclononanyl; 1,4,8,11-tetraazacyclotetradecanyl; 1,4,7,10,13-pentaazacyclopentadecanyl; 1,4-diaza-7-thiacyclononanyl; 1,4-diaza-7-oxa-cyclononanyl; 1,4,7,10-tetraazacyclododecanyl; 1,4-dioxanyl; 1,4,7-trithiacyclononanyl; tetrahydropyranyl; and oxazolidinyl, wherein the heterocycloalkyl may be connected to the compound via any atom in the ring of the selected heterocycloalkyl, keto: the group —C=O— amine: the group —N(R)2 wherein each R is independently selected from: hydrogen; C1-C6-alkyl; C1-C6-alkyl-C6H5; and phenyl, wherein when both R are C1-C6-alkyl both R together may form an —NC3 to an —NC5 heterocyclic ring with any remaining alkyl chain forming an alkyl substituent to the heterocyclic ring, halogen: selected from the group consisting of: F; Cl; Br and I, perhalogen: selected from the group consisting of C1-C6 linear and branched alkyls, phenyl and C1-C6-alkyl-C6H5, in which ≧50% of the hydrogens, preferably ≧80% of the hydrogens and most preferred all hydrogens have been replaced by halogens.

sulphonate: the group —S(O)2OR, wherein R is selected from: hydrogen; C1-C6-alkyl; phenyl; C1-C6-alkyl-C6H5; Li; Na; K; Cs; Mg; and Ca, sulphate: the group —OS(O)2OR, wherein R is selected from: hydrogen; C1-C6-alkyl; phenyl; C1-C6-alkyl-C6H5; Li; Na; K; Cs; Mg; and Ca, sulphone: the group —S(O)2R, wherein R is selected from: hydrogen; C1-C6-alkyl; phenyl; C1-C6-alkyl-C6H5 and amine (to give sulphonamide) selected from the group: —NR'2, wherein each R' is independently selected from: hydrogen; C1-C6-alkyl; C1C6-alkyl-C6H5; and phenyl, wherein when both R' are C1-C6-alkyl both R' together may form an —NC3 to an —NC5 heterocyclic ring with any remaining alkyl chain forming an alkyl substituent to the heterocyclic ring, carboxylate derivative: the group —C(O)OR, wherein R is selected from: hydrogen; C1-C6-alkyl; phenyl; C1-C6-alkyl-C6H5; Li; Na; K; Cs; Mg; and Ca, carbonyl derivative: the group —C(O)R, wherein R is selected from: hydrogen; C1-C6-alkyl; phenyl; C1-C6-alkyl-C6H5 and amine (to give amide) selected from the group: —NR'2, wherein each R' is independently selected from: hydrogen; C1-C6-alkyl; C1-C6-alkyl-C6H5; and phenyl, wherein when both R' are C1-C6-alkyl both R' together may form an —NC3 to an —NC5 heterocyclic ring with any remaining alkyl chain forming an alkyl substituent to the heterocyclic ring, phosphonate: the group —P(O) (OR) 2, wherein each R is independently selected from: hydrogen; C1-C6-alkyl; phenyl; C1-C6-alkyl-C6H5; Li; Na; K; Cs; Mg; and Ca, phosphate: the group —OP(O)(OR)2, wherein each R is independently selected from: hydrogen; C1-C6-alkyl; phenyl; C1-C6-alkyl-C6H5; Li; Na; K; Cs; Mg; and Ca, phosphine: the group —P(R)2, wherein each R is independently selected from: hydrogen; C1-C6-alkyl; phenyl; and C1-C6-alkyl-C6H5, phosphine oxide: the group —P (O) R2, wherein R is independently selected from: hydrogen; C1-C6-alkyl; phenyl; and C1-C6-alkyl-C6H5; and amine (to give phosphonamidate) selected from the group: —NR'2, wherein each R' is independently selected from: hydrogen; C1-C6-alkyl; C1-C6-alkyl-C6H5; and phenyl, wherein when both R' are C1-C6-alkyl both R' together may form an —NC3 to an —NC5 heterocyclic ring with any remaining alkyl chain forming an alkyl substituent to the heterocyclic ring.

Unless otherwise specified the following are more preferred group restrictions that may be applied to groups found within compounds disclosed herein:

alkyl: linear and branched C1-C6-alkyl, alkenyl: C3-C6-alkenyl, cycloalkyl: C6-C8-cycloalkyl, alkoxy: C1-C4-alkoxy, alkylene: selected from the group consisting of: methylene; 1,2-ethylene; 1,3-propylene; butan-2-ol-1,4-diyl; 1,4-butylene; cyclohexane-1,1-diyl; cyclohexan-1,2-diyl; cyclohexan-1,4-diyl; cyclopentane-1,1-diyl; and cyclopentan-1,2-diyl;

aryl: selected from group consisting of: phenyl; biphenyl; naphthalenyl; anthracenyl; and phenanthrenyl, arylene: selected from the group consisting of: 1,2-phenylene; 1,3-phenylene; 1,4-phenylene; 1,2-naphtalenylene; 1,4-naphtalenylene; 2,3-naphtalenylene and 1-hydroxy-2,6-phenylene, heteroaryl: selected from the group consisting of:
pyridinyl; pyrimidinyl; quinolinyl; pyrazolyl; triazolyl; isoquinolinyl; imidazolyl; and oxazolidinyl, wherein the heteroaryl may be connected to the compound via any atom in the ring of the selected heteroaryl, heteroarylene: selected from the group consisting of: pyridin 2,3-diyl; pyridin-2,4-diyl; pyridin-2,6-diyl; pyridin-3,5-diyl; quinolin-2,3-diyl; quinolin-2,4-diyl; isoquinolin-1,3-diyl; isoquinolin-1,4-diyl; pyrazol-3,5-diyl; and imidazole-2,4-diyl, heterocycloalkyl: selected from the group consisting of: pyrrolidinyl; morpholinyl; piperidinyl; piperidinyl; 1,4piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclododecanyl; and piperazinyl, wherein the heterocycloalkyl may be connected to the compound via any atom in the ring of the selected heterocycloalkyl, heterocycloalkylene: selected from the group consisting of:
piperidin-2,6-ylene; piperidin-4,4-ylidene; 1,4-piperazin-1,4-ylene; 1,4-piperazin-2,3-ylene; 1,4-piperazin-2,6-ylene; tetrahydrothiophen-2,5-ylene; tetrahy-drothiophen-3,4-ylene; tetrahydrofuran-2,5-ylene; tetrahydrofuran-3,4-ylene; pyrrolidin-2,5-ylene; pyrrolidin-2,2-ylidene; 1,4,7-triazacyclonon-1,4-ylene; 1,4,7-triazacyclonon-2,3-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-2,3-ylene; 1,4,7,10-tetraazacyclododec-2,2-ylidene; 1,4,7,10,13-entaazacyclopentadec-1,4-ylene; 1,4,7,10,13-pentaazacyclopentadec-1,7-ylene; 1,4-diaza-7-thia-cyclonon-1,4ylene; 1,4-diaza-7-thia-cyclonon-2,3-ylene; 1,4-diaza-7-thia cyclonon-2,2-ylidene; 1,4-diaza-7-oxa-cyclonon-1,4-ylene; 1,4diaza-7-oxa-cyclonon-2,3-ylene; 1,4-diaza-7-oxa-cyclonon-2,2-ylidene; 1,4-dioxan-2,6-ylene; 1,4-dioxan-2,2-ylidene; tetrahydropyran-2,6-ylene; tetrahydropyran-2,5-ylene; and tetrahydropyran-2,2-ylidene, a —C1-C6-alkyl-heterocycloalky, wherein the heterocycloalkyl of the —C1-C6-heterocycloalkyl is selected from the group consisting of: piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclododecanyl; and pyrrolidinyl, wherein the heterocycloalkyl may be connected to the —C1-C6-alkyl via any atom in the ring of the selected heterocycloalkyl, amine: the group —N (R) 2, wherein each R is independently selected from: hydrogen; C1-C6-alkyl; and benzyl, halogen: selected from the group consisting of: F and Cl, perhalogen: selected from the group consisting of C3-C6 linear and branched alkyls, phenyl and C1-C6-alkyl-C6H5, in which ≧80% of the hydrogens, preferably ≧90% of the hydrogens and most preferred all hydrogens have been replaced by halogens, preferably by fluorine.

sulphonate: the group —S(O)2OR, wherein R is selected from: hydrogen; C1-C6-alkyl; Na; K; Mg; and Ca, sulphate: the group —OS(O)2OR, wherein R is selected from: hydrogen; C1-C6-alkyl; Na; K; Mg; and Ca, sulphone: the group —S(O)2R, wherein R is selected from: hydrogen; C1-C6-alkyl; benzyl and amine selected from the group: —NR'2, wherein each R' is independently selected from:
hydrogen; C1-C6-alkyl; and benzyl, carboxylate derivative: the group —C(O)OR, wherein R is selected from hydrogen; Na; K; Mg; Ca; C1-C6-alkyl; and benzyl, carbonyl derivative: the group: —C(O)R, wherein R is selected from: hydrogen; C1-C6-alkyl; benzyl and amine selected from the group: —NR'2, wherein each R' is independently selected from: hydrogen; C1-C6-alkyl; and benzyl, phosphonate: the group —P(O) (OR)2, wherein each R is independently selected from: hydrogen; C1-C6-alkyl; benzyl; Na; K; Mg; and Ca, phosphate: the group —OP(O) (OR)2, wherein each R is independently selected from: hydrogen; C1-C6-alkyl; benzyl; Na; K; Mg; and Ca, phosphine: the group —P(R)2, wherein each R is independently selected from: hydrogen; C1-C6-alkyl; and benzyl, phosphine oxide: the group —P(O)R2, wherein R is independently selected from: hydrogen; C1-C6-alkyl; benzyl and amine selected from the group: —NR'2, wherein each R' is independently selected from: hydrogen; C1-C6-alkyl; and benzyl.

M, $M_n$ (n being an integer): Metal ions (either charged or uncharged), whereby two Metal ions $M_n$ and $M_m$ are independently selected from each other unless otherwise indicated.

Preferably, the hole-transporting compounds are selected from a group containing molecules with the general structure of formula I, formula II, formula III or mixtures thereof:

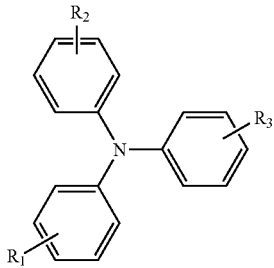

I wherein R1, R2 and/or R3 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

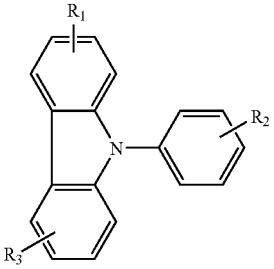

II wherein R1, R2 and/or R3 are independently selected out of a group comprising hydrogen, hydroxyl, halogen, perhalogen, formyl, carboxy- and/or carbonyl derivatives, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

III

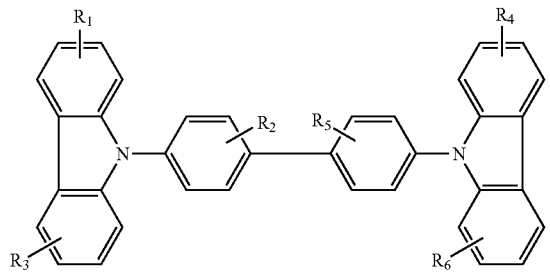

wherein R1, R2, R3, R4, R5 and/or R6 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

Preferably, the electron transporting compounds are selected from a group containing molecules with the general structure of formula IV, formula V, formula VI, formula VII or mixtures thereof:

IV

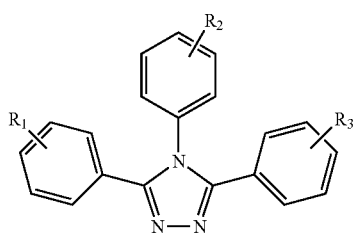

wherein R1, R2 and/or R3 are selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine

V

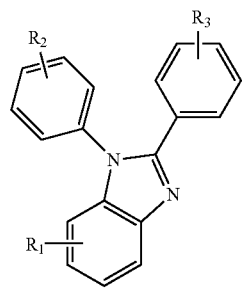

wherein R1, R2 and/or R3 are independently selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

VI

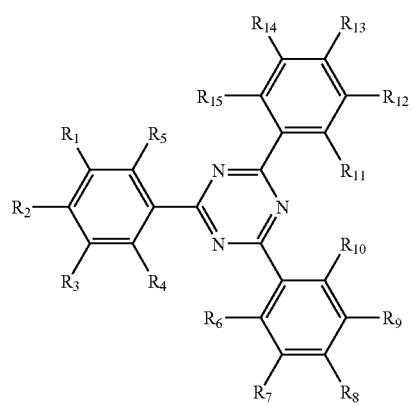

wherein R1, R2, R3, R4, R5, R6, R7, R8, R9, R10, R11, R12, R13, R14 and/or R15 are independently selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

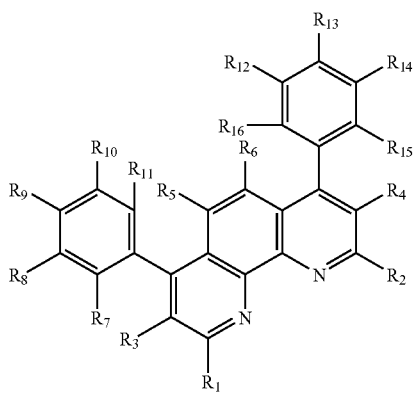

wherein R1, R2, R3, R4, R5, R6, R7, R8, R9, R10, R1, R12, R13, R14, R15 and/or R16 are independently selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

Preferably, the exciton conducting compounds are selected from a group containing molecules with the general structure of formula VIII or mixtures thereof:

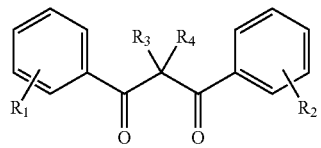

wherein R1, R2, R3 and/or R4 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

A preferred electroluminescent device according to the present invention comprises sequentially at least one first electrode, at least one light emitting layer as described above and at least one second electrode. For the first and second electrode, all electrodes as well as all electrode materials known in the art can be used.

For a better build-up of such an electroluminescent device, it is preferred, that essentially all compounds in the light emitting layer are electrically neutral. This can e.g. achieved in that charged ligands are used to compensate for the metal ion charges. By using a neutrally-charged compounds, the light emitting layer can be build up by vapor deposition.

A preferred lighting unit according to the present invention contains an electroluminescent device as described above and can be used in household applications, shop lighting, home lighting, accent lighting, spot lighting, theater lighting, fiber-optics applications, projection systems, self-lit displays, medical lighting applications, pixelated displays, segmented displays, warning signs, indicator signs, decorative lighting, etc.

The aforementioned components, as well as the claimed components and the components to be used in accordance with the invention in the described embodiments and examples, are not subject to any special exceptions with respect to their size, shape, material selection and technical concept such that the selection criteria known in the pertinent field can be applied without limitations.

Additional details, characteristics, features and advantages of the object of the invention are disclosed in the subclaims and the following description of the examples—which in an exemplary fashion—show several embodiments of the light emitting layer according to the invention.

EXAMPLE 1

In a first example of a light emitting layer of the present invention, the light emitting layer contains the following compounds:

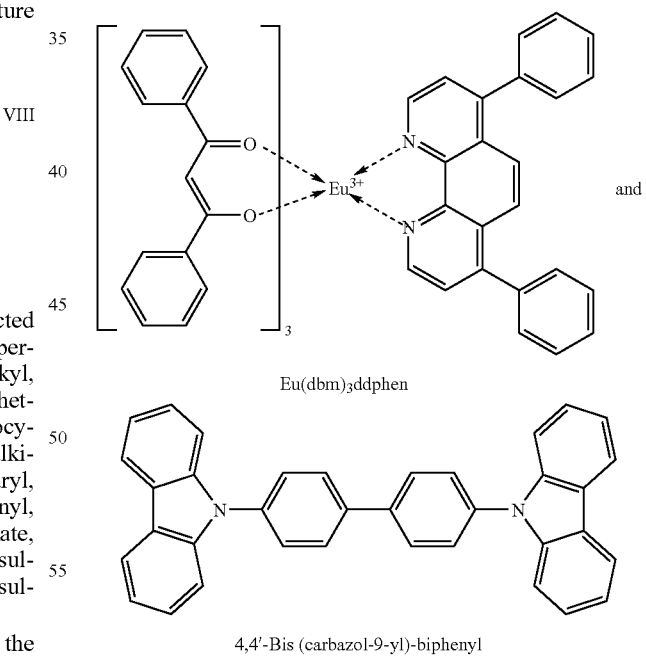

Eu(dbm)₃ddphen 4,4'-Bis (carbazol-9-yl)-biphenyl

The 4,7-Diphenyl-1,10-Phenantrolin serves as electron transporting compound, the 4,4'-Bis(carbazol-9-yl)-biphenyl as hole transporting compound, the rare earth metal ion compound is Europium. The 1,3-Diphenylpropane-1-3-dione acts as exciton conducting compound. The triplet niveaus, oxidation and reduction potentials of these compounds are as follows:

| | 4,7-Diphenyl-1,10-Phenantroline | 4,4'-Bis(carbazol-9-yl)-biphenyl | 1,3-Diphenylpropane-1-3-dione |
|---|---|---|---|
| triplett niveau [1/cm] | 22222 | 21500 | 20300 |
| oxidation potential [V] | <−5.52 | −5.46 | −5.52 |
| reduction potential [V] | −2.84 | >−2.84 | >−2.84 |

As preferred, the 1,3-Diphenylpropane-1-3-dione has the lowest triplet niveau and a higher reduction potential than 4,7-Diphenyl-1,10-Phenantroline as well as a lower oxidation potential than 4,4'-Bis(carbazol-9-yl)-biphenyl. Furthermore, as preferred, the 4,7-Diphenyl-1,10-Phenantroline has the lowest reduction potential and the 4,4'-Bis(carbazol-9-yl)-biphenyl the highest oxidation potential.

EXAMPLE II

In a second example of a light emitting layer of the present invention, the light emitting layer contains the following compounds:

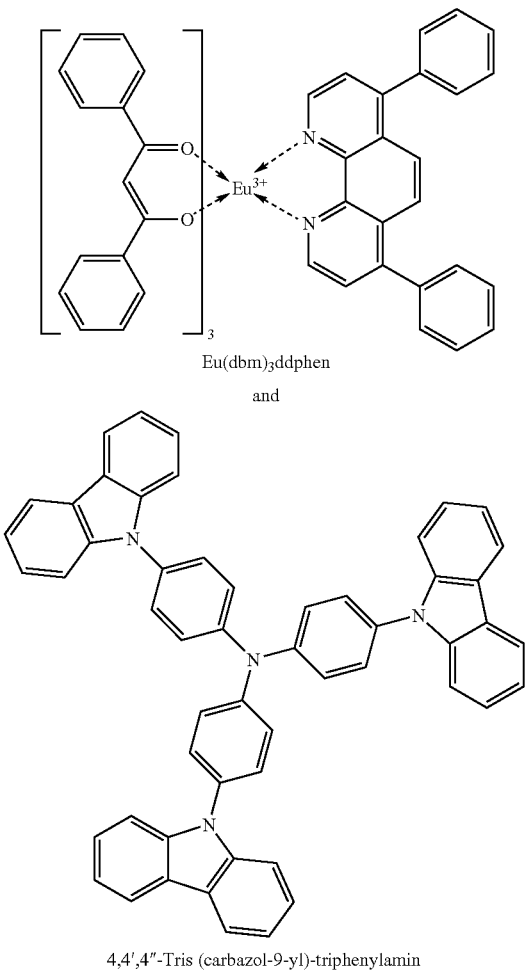

Eu(dbm)₃ddphen and 4,4',4''-Tris (carbazol-9-yl)-triphenylamin

The 4,7-Diphenyl-1,10-Phenantrolin serves as electron transporting compound, the 4,4',4''-Tris(carbazol-9-yl)-triphenylamin as hole transporting compound, the rare earth metal compound is Europium. The 1,3-Diphenylpropane-1-3-dione acts as exciton conducting compound. The triplet niveaus, oxidation and reduction potentials of these compounds are as follows:

| | 4,7-Diphenyl-1,10-Phenantrolin | 4,4',4''-Tris(carbazol-9-yl)-triphenylamin | 1,3-Diphenylpropane-1-3-dione |
|---|---|---|---|
| triplett niveau [1/cm] | 22222 | 23000 | 20300 |
| oxidation potential [V] | <−5.52 | −5.33 | −5.52 |
| reduction potential [V] | −2.84 | >−2.84 | >−2.84 |

As preferred, the 1,3-Diphenylpropane-1-3-dione has the lowest triplet niveau and a higherreduction potential than 4,7-Diphenyl-1,10-Phenantroline as well as a lower oxidation potential than 4,4',4''-Tris(carbazol-9-yl)-triphenylamine. Furthermore, as preferred, the 4,4',4''-Tris(carbazol-9-yl)-triphenylamine has the highest oxidation potential and the 4,7-Diphenyl-1,10-Phenantrolin the lowest reduction potential.

The invention claimed is:

1. A lighting unit with a light emitting layer, comprising at least one electron transporting compound, at least one hole transporting compound and at least one rare earth metal ion compound, wherein the light emitting layer further comprises at least one exciton conducting compound.

2. The lighting unit according to claim 1, wherein the at least one exciton conducting compound has an energetically lower triplet niveau than either the at least one electron transporting compound, the at least one hole transporting compound or both.

3. The lighting unit according to claim 1, wherein the at least one exciton conducting compound has an energetically higher triplet niveau than a resonance level of the at least one rare earth metal ion compound.

4. The lighting unit according to claim 1, wherein an oxidation potential in V against vacuum level of the at least one exciton conducting compound is lower than the oxidation potential of the at least one hole transporting compound and a reduction potential in V against vacuum level of the at least one exciton conducting compound is higher than a reduction potential of the at least one electron transporting compound.

5. The lighting unit according to claim 1, wherein a thickness of the light emitting layer is <0 nm and 60.

6. The lighting unit according to claim 1, wherein a concentration of at least one exiton conducting compound in the light emitting layer is higher than a concentration of either the at least one electron transporting compound, the at least one hole transporting compound or higher than both concentrations of the at least one electron transporting compound and the at least one hole transporting compound.

7. The lighting unit according to claim 1, wherein the at least one hole-transporting compound is selected from a group consisting of molecules with the general structure of formula I, formula II, formula III or mixtures thereof:

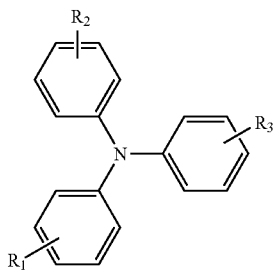

I wherein R1, R2 and/or R3 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine,

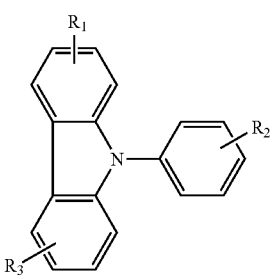

II wherein R1, R2 and/or R3 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine,

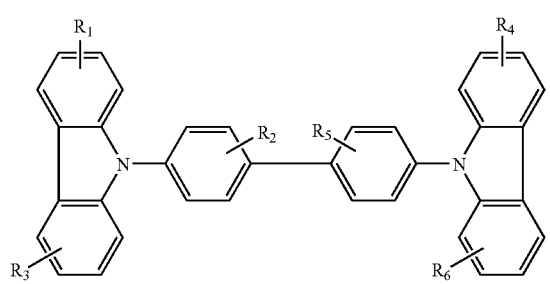

III wherein R1, R2, R3, R4, R5 and/or R6 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

8. The lighting unit according to claim 1, wherein the at least one electron transporting compound is selected from a group consisting of molecules with the general structure of formula IV, formula V, formula VI, formula VII or mixtures thereof:

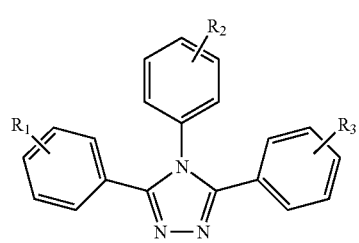

IV wherein R1, R2 and/or R3 are selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine,

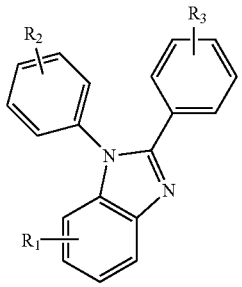

V wherein R1, R2 and/or R3 are independently selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine,

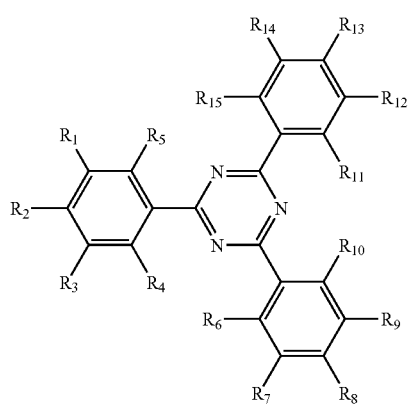

VI wherein R1, R2, R3, R4, R5, R6, R7, R8, R9, R10, R11, R12, R13, R14 and/or R15 are independently selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine,

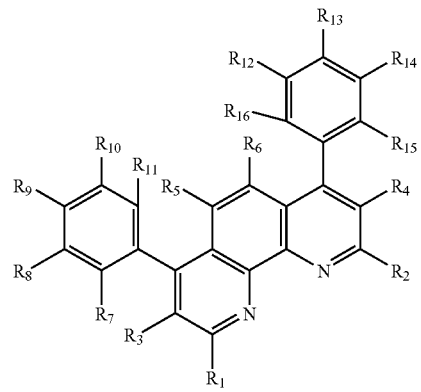

VII wherein R1, R2, R3, R4, R5, R6, R7, R8, R9, R10, R11, R12, R13, R14, R15 and/or R16 are independently selected from a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

9. The lighting unit according to claim 1, wherein the at least one exciton conducting compound is selected from a group consisting of molecules with the general structure of formula VIII or mixtures thereof:

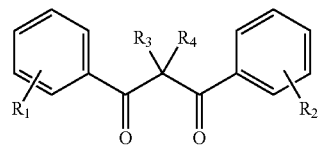

VIII wherein R1, R2, R3 and/or R4 are independently selected out of a group comprising hydrogen, hydroxyl, halogen, perhalogen, formyl, carboxy- and/or carbonyl derivatives, alkyl, cycloalkyl, halogenalkyl, aryl, arylene, halogenaryl, heteroaryl, heteroarylene, heterocycloalkylene, heterocycloalkyl, halogenheteroaryl, alkenyl, halogenalkenyl, alkinyl, halogenalkinyl, keto, ketoaryl, ketohalogenaryl, ketoheteroaryl, ketoalkyl, ketohalogenalkyl, ketoalkenyl, ketohalogenalkenyl, phosphoalkyl, phosphonate, phosphate, phosphine, phosphine oxide, phosphoryl, phosphoaryl, sulphonyl, sulphoalkyl, sulphoarenyl, sulphonate, sulphate, sulphone, amine.

10. A lighting unit comprising a light emitting layer according to claim 1 for the use in
    household applications
    shop lighting,
    home lighting,
    accent lighting,
    spot lighting,
    theater lighting, fiber-optics applications,
projection systems,
self-lit displays,
pixelated displays,
segmented displays,
warning signs,
medical lighting applications,
indicator signs, and
decorative lighting.

11. The lighting unit of claim 1, wherein the at least one exciton conducting compound is configured to prevent a double or multiple excitation of the at least one rare earth metal ion compound.

12. The lighting unit of claim 1, wherein the at least one exciton conducting compound is configured to remove excitation from the at least one rare earth metal ion compound when the at least one rare earth metal ion compound is already excited.

13. The lighting unit of claim 1, wherein a thickness of the light emitting layer is $\geqq 5$ nm and $\leqq 40$.

14. The lighting unit of claim 1, wherein a thickness of the light emitting layer is $\geqq 10$ nm and $\leqq 30$.

* * * * *